(12) United States Patent
Nagano et al.

(10) Patent No.: US 6,733,691 B2
(45) Date of Patent: May 11, 2004

(54) LIQUID CRYSTAL POLYESTER RESIN COMPOSITION

(75) Inventors: Satoshi Nagano, Tsukuba (JP); Hiroyasu Yamauchi, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 128 days.

(21) Appl. No.: 10/105,350

(22) Filed: Mar. 26, 2002

(65) Prior Publication Data
US 2003/0001139 A1 Jan. 2, 2003

(30) Foreign Application Priority Data

Mar. 28, 2001 (JP) ........................................ 2001-092319

(51) Int. Cl.$^7$ ................................................ C09K 19/20
(52) U.S. Cl. .............................. 252/299.67; 252/299.01
(58) Field of Search ..................... 428/1.1; 252/299.01, 252/299.6, 299.62, 299.64, 299.67

(56) References Cited

U.S. PATENT DOCUMENTS 5,976,406 A * 11/1999 Nagano et al.

FOREIGN PATENT DOCUMENTS

| JP | 10-219085 | * | 8/1998 |
| JP | 3045065 | * | 3/2000 |
| JP | 2000-178443 | * | 6/2000 |

* cited by examiner

Primary Examiner—Mark F. Huff
Assistant Examiner—Jennifer R Sadola
(74) Attorney, Agent, or Firm—Birch, Stewart, Kolasch & Birch, LLP

(57) ABSTRACT

A liquid crystal polyester resin composition having an apparent melt viscosity of 10 to 100 Pa·sec at a shearing rate of 1000 sec$^{-1}$ and at a flow temperature +40° C., obtained by compounding 10 to 100 parts by weight of an inorganic filler in the form of fiber and 10 to 100 parts by weight of an inorganic filler in the form of plate based on 100 parts by weight of a liquid crystal polyester resin, wherein the liquid crystal polyester resin contains at least 30% mol of a repeating structural unit of the following formula $A_1$ and has a flow temperature of 270° C. to 400° C., the inorganic filler in the form of fiber has an average fiber diameter of 0.1 to 10 μm and a number-average fiber length of 1 to 100 μm, the inorganic filler in the form of plate has an average particle size of 5 to 20 μm, and the ratio (F/P) of the compounding amount (F) of the inorganic filler in the form of fiber to the compounding amount (P) of the inorganic filler in the form of plate satisfies the following equation;

0<F/P<0.5 or 1.6<F/P<10.

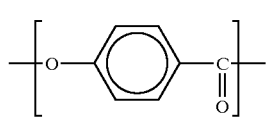

($A_1$)

7 Claims, 1 Drawing Sheet

LIQUID CRYSTAL POLYESTER RESIN COMPOSITION

BACKGROUND OF THE INVENTION

1. Field of the Invention

The present invention relates to a liquid crystal polyester resin composition, and a molded article obtained by using the same. More specifically, the present invention relates to a liquid crystal polyester resin composition having excellent thin-wall flowability and capable of producing a molded article having low warpage property while maintaining excellent heat resistance, and a molded article obtained by using the same.

2. Description of the Related Arts

Liquid crystal polyesters do not cause entangling even under melted condition since the molecule is rigid, form a polydomain having liquid crystal state and show a phenomenon of remarkable orientation of molecular chains along the resin flow direction due to shearing in molding, and generally called a melt liquid crystal type (thermotropic liquid crystal) polymer. Liquid crystal polyesters, due to this specific phenomenon, have excellent melt flowability, show high deflection temperature under load and continuous service temperature depending on the molecular structure, and do not cause deformation and blistering even if immersed in a melted solder of 260° C. or higher.

Therefore, a resin composition obtained by filling reinforcing materials in the form of fiber typified by glass fiber and inorganic fillers typified by talc in a liquid crystal polyester is a material suitable for electric and electronic parts having a thin-wall or complicated portions.

However, recently, there is a development in products having smaller size and smaller thickness, and in lectric and electronic parts, particularly in connector parts, there is a demand for parts further having low warpage property while maintaining heat resistance, mechanical properties and flowability.

For example, JP No. 3045065 discloses a liquid crystal polyester resin composition obtained by filling glass fiber having a number-average fiber length of 0.12 to 0.25 mm in a liquid crystal polyester resin. However, due to use of glass fiber having a larger number-average fiber length, there is a problem of poor flowability and increase a warpage amount when a molded article having a thin part of 0.2 mm or less is produced.

JP-A No. 2000-178443 discloses a liquid crystal polymer composition obtained by compounding a filler in the form of fiber and a filler in the form of particle in a liquid crystal polymer. However, due to high melt viscosity of the liquid crystal polymer composition, there is a problem of increasing the warpage due to remaining stress in molding, leading to insufficient warpage reduction effect.

Further, JP-A No. 10-219085 discloses a liquid crystal polyester resin composition obtained by compounding inorganic fillers in the form of fiber and plate in a liquid crystal polyester at acompounding ratio (fiber/plate) of 1.7. However, there is still required an improvement in flowability and the warpage amount when molded article is formed.

Therefore, there has been a desire for development of a resin composition having excellent flowability and capable of producing a molded article having low warpage property while maintaining excellent heat resistance.

SUMMARY OF THE INVENTION

An object of the present invention is to provide a liquid crystal polyester resin composition having excellent thin-wall flowability and capable of producing a molded article having low warpage property while maintaining excellent heat resistance.

The present inventors have intensively studied to find a liquid crystal polyester resin composition having no problems as described above, and resultantly found that a liquid crystal polyester resin composition obtained by compounding specific inorganic fillers in the form of fiber and plate in a liquid crystal polyester resin having specific flow temperature, at a specific weight ratio, has excellent thin-wall flowability and is capable of producing a molded article having low warpage property while maintaining excellent heat resistance, leading to completion of the invention.

Namely, the present invention provides a liquid crystal polyester resin composition having an apparent melt viscosity of 10 to 100 Pa sec at a shearing rate of 1000 $sec^{-1}$ and at a flow temperature 40° C., obtained by compounding 10 to 100 parts by weight of an inorganic filler in the form of fiber and 10 to 100 parts by weight of an inorganic filler in the form of plate based on 100 parts by weight of a liquid crystal polyester resin, wherein the liquid crystal polyester resin contains at least 30 mol % of a repeating structural unit of the following formula $A_1$ and has a flow temperature of 270° C. to 400° C., the inorganic filler in the form of fiber has an average fiber diameter of 0.1 to 10 $\mu$m and a number-average fiber length of 1 to 100 $\mu$m, the inorganic filler in the form of plate has an average particle size of 5 to 20 $\mu$m, and the ratio (F/P) of the compounding amount (F) of the inorganic filler in the form of fiber to the compounding amount (P) of the inorganic filler in the form of plate satisfies the following equation;

$$0 < F/P < 0.5 \text{ or } 1.6 < F/P < 10.$$

DETAILED DESCRIPTION OF PREFERRED EMBODIMENT

Figure 1:
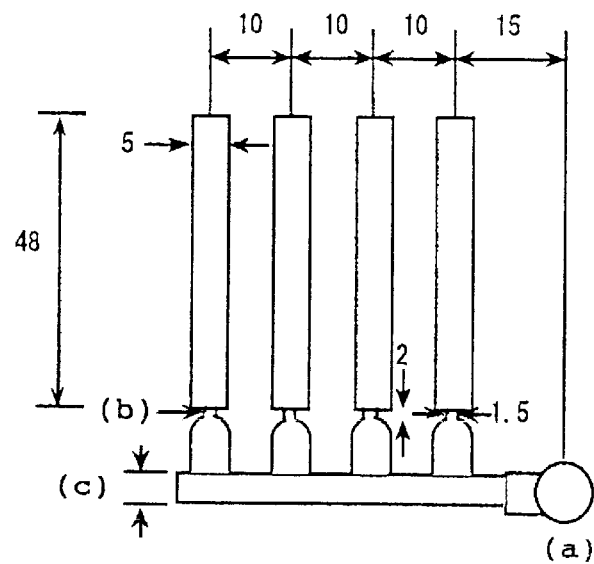
FIG. 1 is an illustration view of a thin flow length measuring mold.
(a) Sprue
(b) Gate (0.2 t×1.5 w×2.01)
(c) Runner diameter (Φ3.0 mm)

The liquid crystal polyester resin used in the present invention is a polyester called a thermotropic liquid crystal polymer, and there are exemplified (1) a polyester made of one or more than two aromatic hydroxycarboxylic acids,
(2) a polyester made of a combination of an aromatic dicarboxylic acid and an aromatic diol,
(3) a polyester made of a combination of an aromatic hydroxycarboxylic acid, an aromatic dicarboxylic acid and an aromatic diol,
(4) a polyester obtained by reacting an aromatic hydroxycarboxylic acid with a polyester such as polyethylene terephthalate and the like, and these polyesters form an anisotropic melted polymer at temperatures of 400° C. or less. In stead of these aromatic dicarboxylic acid, aromatic diol and aromatic hydroxycarboxylic acid, ester-forming derivatives thereof are also used in some cases.

Examples of repeating structural units in the liquid crystal polyester include, but are not limited to, the following units.

Structural units derived from aromatic hydroxycarboxylic acids;

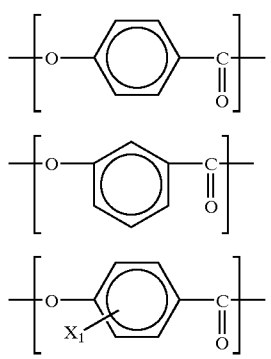
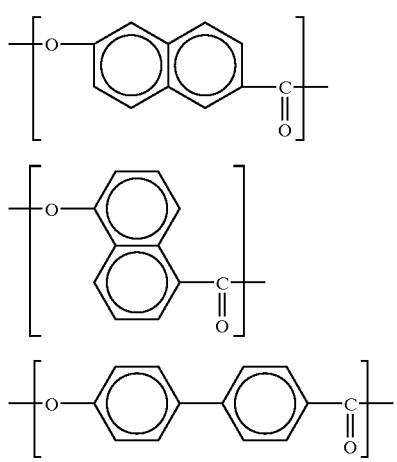
$X_1$: halogen, alkyl
Structural units derived from aromatic dicarboxylic acids;
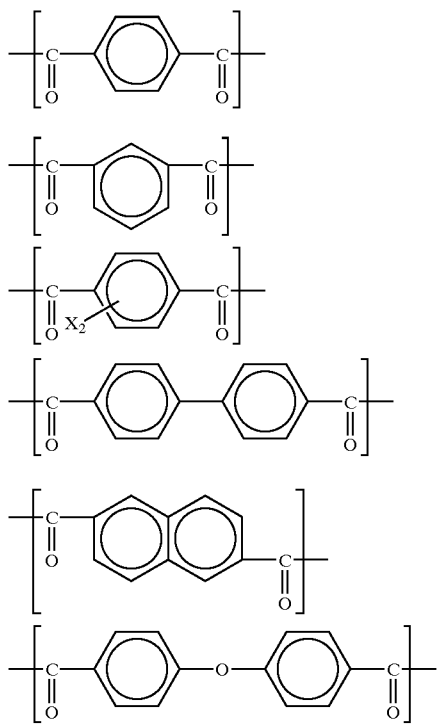
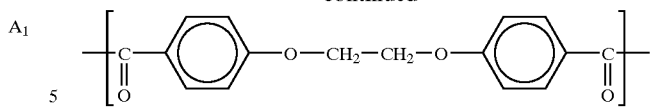 $A_1$
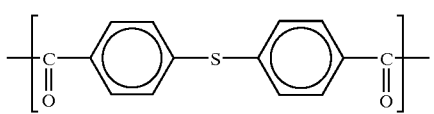 $A_2$
-continued
$X_2$: halogen, alkyl, allyl
Structural units derived from aromatic diols;
 $C_1$
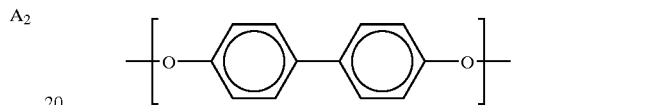 $C_2$
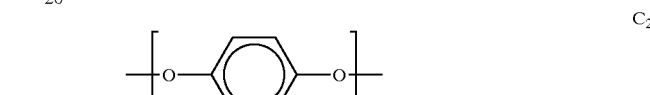 $C_3$
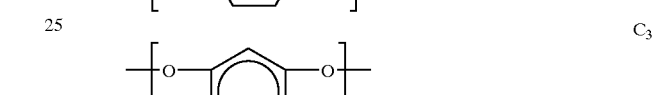
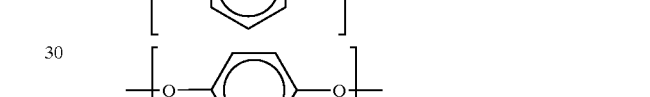
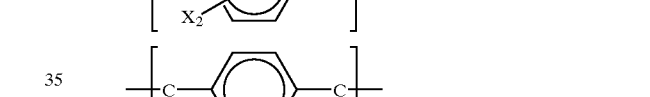
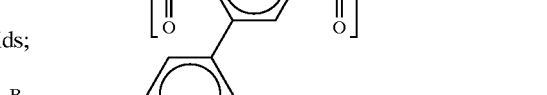
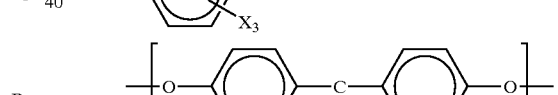
$X_2$: halogen, alkyl, allyl
$X_3$: H, halogen, alkyl
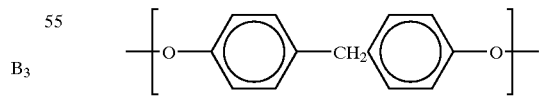
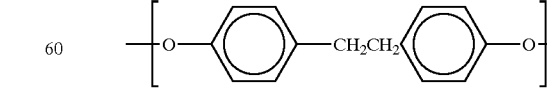
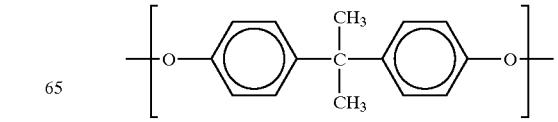

-continued

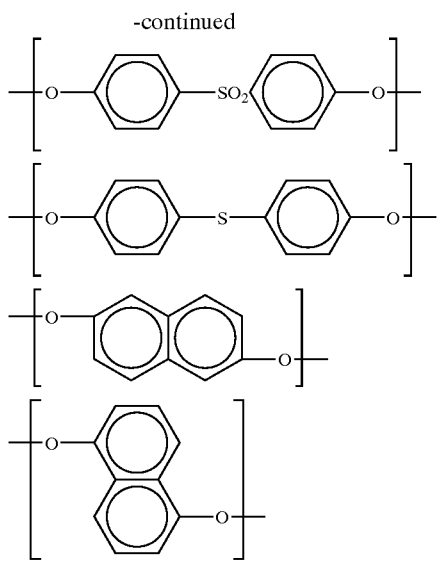

In the above-described formulae, $X_1$ represents a halogen atom or alkyl group, $X_2$ represents a halogen atom, alkyl group or allyl group, and $X_3$ represents a hydrogen atom, halogen atom or alkyl group.

As the halogen atom, a fluorine atom, chlorine atom, bromine atom, iodine atom and the like are listed.

As the alkyl group, alkyl groups having 1 to 6 carbon atoms are listed, and examples thereof include linear aliphatic groups such as a methyl group, ethyl group and the like, and branched aliphatic groups such as a t-butyl group and the like. As the aryl group, aryl groups having 6 to 20 carbon atoms are listed, and examples thereof include a benzene group, naphthalene group and the like.

From the standpoints of heat resistance, mechanical properties and processability, the liquid crystal polyester used in the present invention contains at least 30 mol % of a repeating structural unit of the above-mentioned formula $(A_1)$. Specifically, as combinations of repeating structural units, the following (a) to (f) are exemplified.

(a): a combination of repeating unit $(A_1)$, together with repeating unit $(B_1)$ either alone or together with repeating unit $(B_2)$, and also with repeating unit $(C_1)$.

(b): a combination of repeating units $(A_1)$ and $(A_2)$.

(c): a combination of repeating units $(A_1)$ and $(A_2)$, together with repeating unit $(B_1)$ either alone with repeating unit $(B_2)$, and also with repeating unit $(C_1)$.

(d): a combination of repeating unit $(A_1)$, together with repeating units $(B_1)$ and $(B_3)$ either alone or together with repeating unit $(B_2)$, and also with repeating unit $(C_1)$.

(e): a combination of repeating unit $(A_1)$, together with repeating unit $(B_1)$ either alone or together with repeating unit $(B_2)$, and also with repeating units $(C_1)$ and $(C_3)$.

(f): a combination of repeating units $(A_1)$ and $(A_2)$, together with repeating units $(B_1)$ and $(C_2)$.

As the method of producing a liquid crystal polyester resin used in the present invention, known methods can be adopted. For example, methods of producing the above-mentioned liquid crystal polyester resins (a) and (b) are described in JP-B Nos. 47-47870 and 63-3888.

The liquid crystal polyester resin used in the present invention is a liquid crystal polyester resin having a flow temperature of 270 to 400° C., and preferable is a liquid crystal polyester resin having a flow temperature of 280 to 380° C. When the flow temperature of a liquid crystal polyester is less than 270° C., heat resistance is insufficient. When the flow temperature is over 400° C., dues to heat decomposition of a liquid crystal polyester, and the like, molding processability becomes difficult and an excellent molded article cannot be obtained.

The liquid crystal polyester resin used in the present invention may be a mixture of a liquid crystal polyester resin (A) having a flow temperature of 310° C. to 400° C. and a liquid crystal polyester resin (B) having a flow temperature of 270° C. to 370° C. In this case, the flow temperature of the liquid crystal polyester resin (A) is higher than the flow temperature of the liquid crystal polyester resin (B), and the difference between the flow temperature of the liquid crystal polyester resin (A) and the flow temperature of the liquid crystal polyesterresin (B) is preferably from 10 to 60° C., more preferably from 20 to 60° C. When the difference in the flow temperature is less than 10° C., there is a tendency that an effect of improving the intended low warpage property, thin-wall flowability and the like is not obtained. When the difference in the flow temperature is over 60° C., there is a tendency that, due to heat decomposition of a liquid crystal polyester resin (B), and the like, molding process becomes difficult and an excellent molded article cannot be obtained.

When the above-mentioned liquid crystal polyester resin (A) and liquid crystal polyester resin (B) are mixed, the liquid crystal polyester resins (A) and (B) each comprises the above-mentioned structural units (I), (II), (III) and (IV) and, in both resins, the molar ratio (II)/(I) is preferably 0.2 or more and 1.0 or less, the molar ratio (III)+(IV)/(II) is preferably 0.9 or more and 1.1 or less and the molar ratio (IV)/(III) is preferably over 0 and 1 or less, and the molar ratio ($\alpha$)/molar ratio ($\beta$) showing a ratio of the molar ratio ($\alpha$) of (IV)/(III) in the liquid crystal polyester resin (A) to the molar ratio ($\beta$) of (IV)/(III) in the liquid crystal polyester resin (B) is preferably 0.1 or more and 0.5 or less.

When the above-mentioned liquid crystal polyester resin (A) and liquid crystal polyester resin (B) are mixed, the compounding ratio of the liquid crystal polyester resin (B) is preferably from 10 to 150 parts by weight, more preferably from 10 to 100 parts by weight based on 100 parts by weight of the liquid crystal polyester resin (A). When the compounding ratio of the liquid crystal polyester resin (B) is less than 10 parts by weight, there is a tendency that an effect of improving the intended low warpage property, thin-wall flowability and the like is not obtained. When the compounding ratio of the liquid crystal polyester resin (B) is over 150 parts by weight, there is a tendency of decrease in heat resistance and decrease in mechanical properties.

The inorganic filler in the form of fiber used in the present invention has an average fiber diameter of 0.1 to 10 µm, preferably 0.5 to 10 µm. When the average fiber diameter is less than 0.1 µm, an effect of improving the intended low warpage property and heat resistance becomes insufficient. When the average fiber diameter is over 10 µm, an effect of improving flowability and low warpage property becomes insufficient.

The number-average fiber length is from 1 to 100 µm, preferably from 5 to 90 µm. When the number-average fiber length is less than 1 µm, an effect of improving the intended heat resistance and mechanical strength becomes insufficient. When the number-average fiber length is over 100 µm, an effect of improving low warpage property decreases, and appearance of a molded article and uniform dispersibility in a molded article deteriorate.

Examples of the inorganic filler in the form of fiber include, but not limited to, glass fiber, wollastonite, aluminum borate whisker, potassium titanate whisker, silica alumina fiber, alumina fiber, carbon fiber and the like. Of them, glass fiber, wollastonite, aluminum borate whisker and potassium titanate whisker are preferably used. These may be used alone or in combination of two or more.

The inorganic filler in the form of plate used in the present invention is an inorganic substance which forms a crystal structure in the form of flat layer by a chemical bond and in which cleavage tends to occur since layers are bonded by weak van der Waals force, leading to particles in the form of plate in grinding. Here, the form of plate means that the ratio of the major axis to the thickness if 2 or more.

The average particle size of the inorganic filler in the form of plate used in the present invention is from 5 to 20 $\mu$m, preferably from 10 to 20 $\mu$m. When the average particle size is less than 5 $\mu$m, an effect of improving the intended low warpage property and heat resistance becomes insufficient. When the average particle size is over 20 $\mu$m, problems occur in appearance of a molded article, uniform dispersibility in a molded article, and the like.

Examples of the inorganic filler in the form of plate include, but are not limited to, talc, mica, kaolin clay, dolomite and the like. Of them, talc and mica are preferably used. These maybe used alone or in combination of two or more simultaneously.

The compounding proportion of the inorganic filler in the form of fiber is from 10 to 100 parts by weight, preferably from 10 to 70 parts by weight based on 100 parts by weight of a liquid crystal polyester resin. The compounding proportion of the inorganic filler in the form of plate is from 10 to 100 parts by weight, preferably from 10 to 70 parts by weight based on 100 parts by weight of a liquid crystal polyester resin.

When the compounding proportion of the inorganic filler in the form of fiber or plate is less than 10 parts by weight, an effect of improving low warpage property and heat resistance becomes insufficient though an effect of improving thin-wall flowability is recognized. Further, the compounding proportion of the inorganic filler in the form of fiber or plate is over 100 parts by weight, an effect of improving thin-wall flowability becomes insufficient, and additionally, abrasion of a cylinder and mold in a molding machine increases.

The ratio (F/P) of the compounding amount (F) of the inorganic filler in the form of fiber to the compounding amount (P) of the inorganic filler in the form of plate is more than 0 and less than 0.5 or more than 1.6 and less than 10, preferably more than 0.1 and less than 0.5 or more than 1.6 and less than 6. When the ratio (F/P) of the compounding amount (F) of the inorganic filler in the form of fiber to the compounding amount (P) of the inorganic filler in the form of plate is 0.5 or more and 1.6 or less, and when 10 or more, a balance between low warpage property and stability in melt viscosity deteriorates.

In the liquid crystal polyester resin composition of the present invention, the apparent melt viscosity at a temperature of the flow temperature +40° C. and a shearing rate of 1000 sec$^{-1}$ defined below is from 10 to 100 Pa·sec, preferably from 10 to 50 Pa·sec, more preferably from 10 to 30 Pa·sec. When the apparent melt viscosity is over 100 Pa·sec, the thin-wall flowability decreases, and there are cases of occurring short-shot problems and damages of core pins in a mold. When the apparent melt viscosity is less than 10 Pa·sec, flash problems and the like occur.

Here, the flow temperature means a temperature at which the melt viscosity is 4800 Pa·s when a heat-melted polymer is extruded through a nozzle at a temperature rising rate of 4° C./min under a load of 100 kg/cm$^2$ using a capillary rheometer having a nozzle of an internal diameter of 1 mm and a length of 10 mm.

Into the liquid crystal polyester resin composition used in the present invention, usual additives such as inorganic fillers such as glass bead and the like; release improving agents such as fluorine resins, metal soaps and the like; coloring agents such as dyes, pigments and the like; antioxidants; heat stabilizers; ultraviolet absorbers; antistatic agents; surfactants and the like may be added in an amount not deteriorating the object of the present invention.

Further, those having an external lubricating effect such as higher fatty acids, higher fatty esters, metal salts of higher fatty acids, fluorocarbon-based surfactants and the like may also be added.

Furthermore, a small amount of thermoplastic resin, for example, polyamide, polyester, polyphenylene sulfide, polyether ketone, polycarbonate, polyphenylene ether and modified substance thereof, polysulfone, polyether sulfone, polyether imide or the like, or a small amount of thermosetting resin, for example, a phenol resin, epoxy resin, polyimide resin or the like, may also be added.

The means of compounding raw material components for obtaining the liquid crystal polyester resin composition of the present invention is not particularly restricted. It may also permissible that a liquid crystal polyester, inorganic fillers in the form of fiber and plate, further, if necessary, components such as an inorganic filler, mold release improving agent, heat stabilizer and the like are fed into a melt-mixing machine separately, or these raw material components are mixed previously by utilizing a mortar, Henschel mixer, ball mill, ribbon, blender and the like before being fed to a melt-mixing machine. It is also possible that a liquid crystal polyester and an inorganic filler in the form of fiber, and a liquid crystal polyester and an inorganic filler in the form of plate, are fed separately to a melt-mixing machine and palletized, and both of them are mixed in the form of pallet, to realize given compounding amount.

By using the liquid crystal polyester resin composition of the present invention, a molded article having excellent thin-wall flowability and low warpage property can be produced while maintaining excellent heat resistance, and ultra-thin molded article having a thickness of 0.2 mm or less can be produced more easily than conventional. Thus obtained ultra-thin molded article is a molded article showing low warpage property of a warpage amount of less than 0.05 mm.

Therefore, the liquid crystal polyester resin composition of the present invention is suitably used for electric and electronic parts such as connectors, sockets, relay parts, coil bobbins, optical pickups, oscillator, resonator, print circuit boards, computer associated parts and the like; home electric and electronic product parts such as VTR, televisions, irons, air conditioners, stereos, cleaners, refrigerators, rice boilers, illumination equipments and the like; illumination equipment parts such as lamp reflectors, lamp holders and the like; audio product parts such as compact disks, laser disks, speakers and the like; communication equipment parts such as ferrules for optical cable, phone parts, facsimile parts, modems and the like; printer associated parts such as separation nails, heater holders and the like; machine parts such as impellers, fan gears, gears, bearings, motor parts, cases and the like; automobile parts such as mechanical parts for automobile, engine parts, parts in engine room, electric parts, interior parts and the like; cooking apparatuses such as micro wave cooking pans, heat resistance dishes and the like; heat insulation and sound insulation materials such as floor materials, wall materials and the like, supporting materials such as beams, pillars and the like, construction materials such as roof materials and the like, or civil construction materials; parts for airplanes, space crafts, aeronautic apparatuses and the like; parts for radiation facilities such as nuclear reactors and the like, marine facility members, washing jigs, parts for optical apparatuses, bulbs, pipers, nozzles, filters, membranes, parts for medical instruments, and medical materials, parts for sensors, sanitary equipments, sports goods, leisure goods and the like.

EXAMPLES

The following examples will described the present invention, but do not limit the scope of the invention. Physical properties in examples were measured by the following methods.

(1) Molding Shrinkage Ratio, Anisotropy Ratio

A specimen was produced by using a flat specimen mold having a length of each edge of 64 mm and a thickness of 3 mm one edge of which constituting a film gate, and the length of each edge of the molded article was measured by a micro meter. The molding shrinkage rate of each edge was calculated by dividing the difference between of this measured value and the size of a molded at normal temperature by the size of a mold, and the average value regarding two edges along the flow direction of the resin was calculated as the molding shrinkage ratio of flow direction (MD) and the average value regarding two edges vertical to the flow direction of the resin was calculated as the molding shrinkage ratio of vertical direction (TD).

The anisotropy ratio (MD/TD) was calculated by dividing the molding shrinkage ratio of flow direction (MD) by the molding shrinkage ratio of vertical direction (TD). Here, when the anisotropy ratio is nearer to 1, anisotropy is smaller.

(2) Tensile Strength

The tensile strength was measured according to ASTM D638 using ASTM No. 4 dumbbell.

(3) Bending Modulus

The bending modulus was measured according to ASTM D790 using a specimen in the form of rod having a width of 12.7 mm, a length of 127 mm and a thickness of 6.4 mm.

(4) Deflection Temperature Under Load (TDUL)

The deflection temperature under load was measured according to ASTM D648 using a specimen in the form of rod having a width of 6.4 mm, a length of 127 mm and a thickness of 12.7 mm, at a load of 1.82 MPa and a temperature rising rate of 2° C./min.

(5) Flow Temperature 2 g of a measuring sample was weighed and set on an apparatus, capillary rheometer having a nozzle of an internal diameter of 1 mm and a length of 10 mm (CFT-500 type, manufactured by Shimadzu Corp.), and the melt viscosity was measured under a load of 100 kg/cm² while raising temperature from 280° C. at a temperature rising rate of 4° C./min. A temperature at which the melt viscosity was 4800 Pa·s was recording as the flow temperature.

(6) Melt Viscosity

A capillary rheometer having a nozzle of an internal diameter of 0.5 mm and a length of 10 mm (Capillograph 1B, manufactured by Toyo Seiki Seisakusho K.K.) was set at given temperature, then, 8 g of a measuring sample was weighed and set on the apparatus, and the melt viscosity as a shearing rate of 1000 sec$^{-1}$ was measured.

(7) Warpage amount

Figure 2:
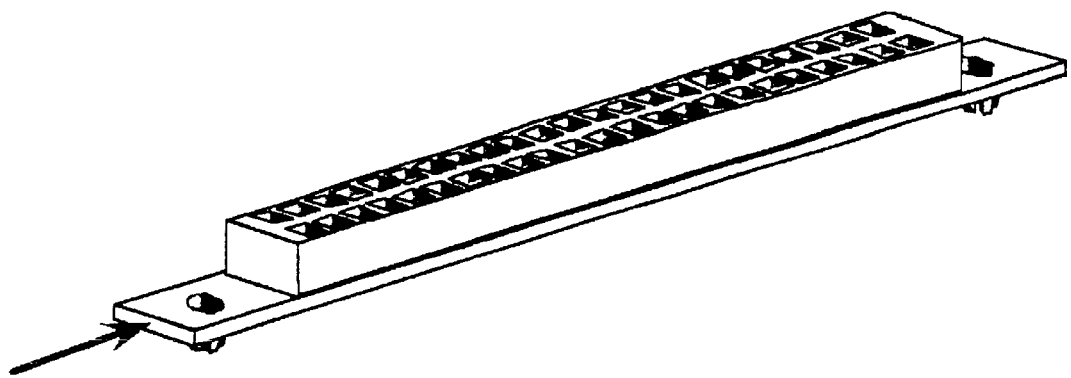
FIG. 2 is a perspective view of a connector mold.

A sample was molded by an injection molding machine (UH-1000 type, manufactured by Nissei Jushi Kogyo K.K.) utilizing a connector mold shown in FIG. 2, under conditions of an injection speed of 200 mm/sec and a holding pressure of 50 Mpa. Regarding the removed molded article, the height from the surface plate was measured by a micro meter at every 1 mm from the gate side to the reverse gate side, and variation from the standard surface of each measured value was obtained, hypothesizing the position of the gate side as the standard surface. This was subjected to the least square program to known the warpage form, and the maximum value thereof was used as the warp amount of each molded article, and the average value of five molded articles was used as the warpage amount.

Example 1

A mixture of LCP1 in which the molar ratio of hydroxybenzoic acid:4.4'-dihydroxydiphenyl:terephthalic acid::isophthalic acid was 60:20:15:5 and the flow temperature defined in the above-mentioned method was 321° C. and LCP2 in which the molar ratio of p-hydroxybenzoic acid : 4.4'-dihydroxydiphenyl: terephthalic acid : isophthalic acid was 60:20:12:8 and the flow temperature defined in the above-mentioned method was 290° C. was used as a liquid crystal polyester resin, and into this was mixed GF1 (glass fiber: EFDE50-01 manufactured by Central Glass Co. Ltd., number-average fiber length: 50 μm, number-average fiber diameter: 6 μm) as an inorganic filler in the form of fiber and talc 1 (talc: X-50 manufactured by Nippon Talc K.K. , average particle size: 14.5 μm) as an inorganic filler in the form of plate in the formulation as shown in Table 1, by a Henschel mixer, then, the mixture was granulated by using a twin-screw extruder (PCM-30, manufactured by Ikegai Corp.) at a cylinder temperature of 330° C., to obtain a liquid crystal polyester resin composition.

These liquid crystal polyester resin compositions were dried at 120° C. for 12 hours, then, a 64 mm×64 mm×3 mm flat plate specimen, ASTM No. 4 dumbbell, specimen in the form of rod, JIS K7113 No. (½) specimen and connector were molded by using an injection molding machine (PS40E5ASE type, manufactured by Nissei Jushi Koyo K.K.) at a cylinder temperature of 350° C. and a mold temperature of 130° C. These specimens were subjected to measurements of the molding shrinkage ratio, anisotropy ratio, tensile strength, bending modulus, TDUL and warpage amount. The results are shown in Table 1.

Comparative Examples 1 and 2

Specimens were produced in the same manner as in Example 1 excepting that LCP1 as a liquid crystal polyester, GF3 (glass fiber: EFH75-01 manufactured by Central Glass Co. Ltd., number-average fiber length: 75 μm, number-average fiber diameter: 11 μm) as an inorganic filler in the form of fiber, and, a resin composition containing no inorganic filler in the form of plate (Comparative Example 1), LCP1 as a liquid crystal polyester, talc1 as a inorganic filler in the form of plate, and, a resin composition containing no inorganic filler in the form of fiber (Comparative Example 2), were used, and subjected to the measurements. The results are shown in Table 1.

Examples 2 and 3

Specimens were produced in the same manner as in Example 1 excepting that whisker1 (aluminum borate whisker: Alubolex Y manufactured by Shikoku Chemicals Corp. number-average fiber length: 20 μm, number-average fiber diameter: 0.7 μm) was used instead of GF1 as a inorganic filler in the form of fiber (Example 2) and GF2 (glass fiber:

EFDE90-01 manufactured by Central Glass Co. Ltd., number-average fiber length: 90 μm, number-average fiber diameter: 6 μm) was used instead of GF1 as a inorganic filler in the form of fiber (Example 2), and subjected to the measurements. The results are shown in Table 1.

Comparative Example 3

A specimen was produced in the same manner as in Example 1 excepting that LCP1 as a liquid crystal polyester, GF2 as an inorganic filler in the form of fiber, and talc2 (talc: S talc manufactured by Nippon Talc K.K., average particle size: 10 μm) as an inorganic filler in the form of plate, were used (ratio inorganic filler in the form of fiber/inorganic filler in the form of plate=1.5), and subjected to the measurements. The results are shown in Table 1.

Comparative Example 4

A specimen was produced in the same manner as in Example 1 excepting that GF4 (glass fiber: CS03JAPX-1 manufactured by Asahi Glass Fiber K.K., number-average fiber length: 3 mm, number-average fiber diameter: 10 μm) as an inorganic filler in the form of fiber and talc1 as an inorganic filler in the form of plate were used, and subjected to the measurements. The results are shown in Table 1.

Comparative Example 5

A specimen was produced in the same manner as in Example 1 excepting that LCP3 in which the molar ratio of p-hydroxybenzoic acid:4,4'-dihydroxydiphenyl :hydroquinone terephthalic acid:isophthalic acid was 40:6.9:23.1:16.4:13.6 and the flow temperature defined in the above-mentioned method was 308° C. as a liquid crystal polyester resin, GF2 as an inorganic filler in the form of fiber and talc1 as an inorganic filler in the form of plate, were used, and subjected to the measurements. The results are shown in Table 1.

It is known that in Example 1, the warpage amount is small and the mechanical strength and heat resistance are excellent, though the anisotropy is weaker (anisotropy ratio is bigger) as compared with Comparative Example 1. On the other hand, in Comparative Example, the warpage amount is 0.05 mm, meaning non-practical use.

In Comparative Example 2, the anisotropy is excellent as in Example 1, however, due to low strength, a connector for measuring warpage amount cannot molded, meaning non-practical use.

In Examples 2 and 3, the low warpage property, mechanical strength and heat resistance are excellent as in Example 1.

In Comparative Example 3, the warpage amount is 0.05 mm, meaning non-practical use.

In Comparative Example 4, the warpage amount is 0.06 mm, meaning non-practical use.

In Comparative Example 5, the warpage amount is 0.05 mm, meaning non-practical use.

TABLE 1

|  |  |  | Example | | |
|---|---|---|---|---|---|
|  |  | Unit | 1 | 2 | 3 |
| Liquid crystal polyester | LCP1 | part by weight | 60 | 60 | 60 |
|  | LCP2 | part by weight | 40 | 40 | 40 |
|  | LCP3 | part by weight |  |  |  |
| Inorganic filler in the form of fiber | GF1 | part by weight | 17 |  |  |
|  | GF2 | part by weight |  |  | 45 |
|  | GF3 |  |  |  |  |
|  | GF4 |  |  |  |  |
|  | Whisker 1 | part by weight |  | 17 |  |
| Inorganic filler in the form of plate | Talc1 | part by weight | 50 | 50 | 22 |
|  | Talc2 | part by weight |  |  |  |
| Ratio of inorganic filler in the form of fiber/inorganic filler in the form of plate |  |  | 0.34 | 0.34 | 2.1 |
| Molding shrinkage ratio | MD | % | 0.20 | 0.11 | 0.15 |
|  | TD | % | 0.65 | 0.67 | 0.88 |
| Anisotropy ratio | MD/TD |  | 0.31 | 0.16 | 0.17 |
| Tensile strength |  | MPa | 103 | 114 | 138 |
| Bending modulus |  | GPa | 11.5 | 12.2 | 12.9 |
| TDUL |  | ° C. | 253 | 251 | 267 |
| Flow temperature |  | ° C. | 303 | 305 | 306 |
| Melt viscosity (Measuring temperature for melt viscosity) |  | Pa·s ° C. | 27.7 (343) | 24.7 (345) | 22.9 (346) |
| Warpage amount |  | mm | 0.01 | 0.01 | 0.03 |

|  |  |  | Comparative example | | | | |
|---|---|---|---|---|---|---|---|
|  |  | Unit | 1 | 2 | 3 | 4 | 5 |
| Liquid crystal polyester | LCP1 | part by weight | 100 | 100 | 100 | 60 |  |
|  | LCP2 | part by weight |  |  |  | 40 |  |
|  | LCP3 | part by weight |  |  |  |  | 100 |
| Inorganic filler in the form of fiber | GF1 | part by weight |  |  |  |  |  |
|  | GF2 | part by weight |  |  | 60 |  | 45 |
|  | GF3 |  |  | 67 |  |  |  |
|  | GF4 |  |  |  |  | 34 |  |
|  | Whisker 1 | part by weight |  |  |  |  |  |
| Inorganic filler in the form of plate | Talc1 | part by weight |  | 82 |  | 20 | 22 |
|  | Talc2 | part by weight |  |  | 40 |  |  |
| Ratio of inorganic filler in the form of fiber/inorganic filler in the form of plate |  |  | ∞ | 0 | 1.5 | 1.7 | 2.1 |
| Molding shrinkage ratio | MD | % | 0.18 | 0.20 | 0.22 | 0.11 | 0.10 |
|  | TD | % | 1.16 | 0.65 | 0.66 | 0.63 | 0.73 |
| Anisotropy ratio | MD/TD |  | 0.16 | 0.31 | 0.33 | 0.17 | 0.14 |
| Tensile strength |  | MPa | 147 | 98 | 126 | 134 | 148 |
| Bending modulus |  | GPa | 12.5 | 10.4 | 13.5 | 12.1 | 13.3 |
| TDUL |  | ° C. | 279 | 266 | 284 | 270 | 219 |
| Flow temperature |  | ° C. | 320 | 319 | 320 | 308 | 308 |
| Melt viscosity (Measuring temperature for melt viscosity) |  | Pa·s ° C. | 33.2 (360) | 38.2 (359) | 49.1 (360) | 53.2 (348) | 115.1 (348) |
| Warpage amount |  | mm | 0.05 | Impossible measurement | 0.05 | 0.06 | 0.05 |

By using the liquid crystal polyester resin composition of the present invention, a molded article having excellent thin-wall flowability and low warpage property can be produced while maintaining excellent heat resistance. Therefore, an ultra-thin molded article having a thickness of 0.2 mm or less can be produced more easily than conventional, particularly, a connector can be produced efficiently.

What is claimed is:

1. A liquid crystal polyester resin composition having an apparent melt viscosity of 10 to 100 Pa sec at a shearing rate of 1000 sec$^{-1}$ and at a flow temperature 40° C., obtained by compounding 10 to 100 parts by weight of an inorganic filler in the form of fiber and 10 to 100 parts by weight of an inorganic filler in the form of plate based on 100 parts by weight of a liquid crystal polyester resin, wherein the liquid crystal polyester resin contains at least 30% mol of a repeating structural unit of the following formula $A_1$ and has a flow temperature of 270° C. to 400° C., the inorganic filler in the form of fiber has an average fiber diameter of 0.1 to 10 μm and a number-average fiber length of 1 to 100 μm, the inorganic filler in the form of plate has an average particle size of 5 to 20 μm, and the ratio (F/P) of the compounding amount (F) of the inorganic filler in the form of fiber to the compounding amount (P) of the inorganic filler in the form of plate satisfies the following equation;

0<F/P<0.5 or 1.6<F/P<10.

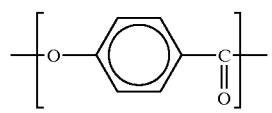

(A₁)

2. The liquid crystal polyester resin composition according to claim 1, wherein said liquid crystal polyester resin comprises 100 parts by weight of a liquid crystal polyester resin (A) and 10 to 150 parts by weight of a liquid crystal polyester resin (B), the liquid crystal polyester resin (A) has a flow temperature of 310° C. to 400° C., the liquid crystal polyester resin (B) has a flow temperature of 270° C. to 370° C., and the flow temperature of the liquid crystal polyester resin (A) is higher than the flow temperature of the liquid crystal polyester resin (B) and the difference thereof is 10 to 60° C.

3. The liquid crystal polyester resin composition according to claim 2, wherein said liquid crystal polyester resins (A) and (B) each comprises the following structural units (I), (II), (III) and (IV), the molar ratio (II)/(I) is 0.2 or more and 1.0 or less, the molar ratio [(III)+(IV)]/(II) is 0.9 or more and 1.1 or less and the molar ratio (IV)/(III) is over 0 and 1 or less, and a ratio of the molar ratio (α) of (IV)/(III) in the liquid crystal polyester resin (A) to the molar ratio (β) of (IV)/(III) in the liquid crystal polyester resin (B) is 0.1 or more and 0.5 or less.

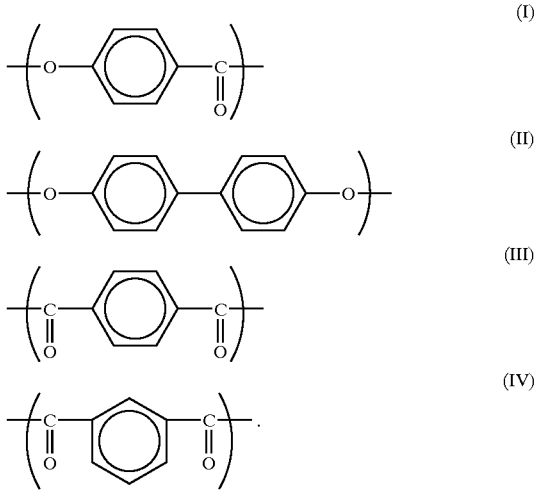

4. The liquid crystal polyester resin composition according to any of claims 1, wherein as the inorganic filler in the form of fiber, at least one selected from glass fiber, wollastonite, aluminum borate whisker and potassium titanate whisker is used.

5. The liquid crystal polyester resin composition according to any of claims 1, wherein as the inorganic filler in the form of plate, at least one selected from mica and talc is used.

6. A molded article having a minimum thickness of 0.2 mm or less, obtained by molding the liquid crystal polyester resin composition according to claim 1.

7. A connector having a minimum thickness of 0.2 mm or less, obtained by molding the liquid crystal polyester resin composition according to claim 1.

* * * * *